(12) United States Patent
Hayamizu et al.

(10) Patent No.: US 9,373,932 B2
(45) Date of Patent: Jun. 21, 2016

(54) SEMICONDUCTOR LASER MODULE (71) Applicant: FURUKAWA ELECTRIC CO., LTD., Chiyoda-ku, Tokyo (JP)

(72) Inventors: Naoki Hayamizu, Tokyo (JP); Yuta Ishige, Tokyo (JP); Toshio Kimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/535,357

(22) Filed: Nov. 7, 2014

(65) Prior Publication Data

US 2015/0131692 A1 May 14, 2015

Related U.S. Application Data

(63) Continuation of application No. PCT/JP2013/053624, filed on Feb. 15, 2013.

(30) Foreign Application Priority Data

May 8, 2012 (JP) ................................. 2012-107012

(51) Int. Cl.
*H01S 5/06* (2006.01)
*G02B 6/42* (2006.01)
(Continued)

(52) U.S. Cl.
CPC ................ *H01S 5/06* (2013.01); *G02B 6/4206* (2013.01); *G02B 6/4214* (2013.01); *H01S 5/4012* (2013.01); *G02B 6/32* (2013.01); (Continued)

(58) Field of Classification Search
CPC . H01S 5/0071; H01S 5/02292; H01S 5/4012; H01S 5/4031; H01S 5/4075
See application file for complete search history.

(56) References Cited

U.S. PATENT DOCUMENTS

| 4,958,893 A | 9/1990 | Noguchi et al. |
| 5,758,950 A | 6/1998 | Naoe et al. |

(Continued)

FOREIGN PATENT DOCUMENTS

| JP | 61208023 A | 9/1986 |
| JP | 5175614 A | 7/1993 |

(Continued)

OTHER PUBLICATIONS

International Search Report for PCT/JP2013/053624 mailed Mar. 12, 2013.

(Continued)

*Primary Examiner* — Yuanda Zhang
*Assistant Examiner* — Michael Carter
(74) *Attorney, Agent, or Firm* — Hauptman Ham, LLP (57) ABSTRACT

A semiconductor laser module 1 is mainly composed of a package 3, a semiconductor laser 5, lenses 7, 9, 13, reflecting mirrors 11, an optical fiber 15, and the like. The package 3 is composed of a bottom part and side surfaces 19a, 19b. The side surfaces 19a, 19b stand erect approximately vertical to the bottom part of the package. In the semiconductor laser module 1, a plurality of semiconductor laser installation surfaces 17 are formed in a step-like shape. On each semiconductor laser installation surface 17, a semiconductor laser 5 is installed. A lens 7 is arranged at the anterior (in the emission direction) of the semiconductor laser 5. Moreover, a lens 9 is arranged further to the anterior. A reflecting mirror 11 is fixed to the side surface 19a, which is provided facing the emission direction of the semiconductor laser 5.

7 Claims, 12 Drawing Sheets

(51) Int. Cl.
*H01S 5/40* (2006.01)
*G02B 6/32* (2006.01)
*H01S 5/00* (2006.01)
*H01S 5/022* (2006.01)

(52) U.S. Cl.
CPC ............ *H01S 5/005* (2013.01); *H01S 5/02208* (2013.01); *H01S 5/02284* (2013.01)

(56) References Cited

U.S. PATENT DOCUMENTS

| | | | |
|---|---|---|---|
| 6,044,096 A * | 3/2000 | Wolak et al. | 372/36 |
| 7,733,932 B2 * | 6/2010 | Faybishenko | 372/36 |
| 8,203,775 B1 * | 6/2012 | Yin | G02B 26/0866 359/221.2 |
| 2008/0019010 A1 * | 1/2008 | Govorkov et al. | 359/641 |
| 2009/0245315 A1 | 10/2009 | Faybishenko | |
| 2012/0177074 A1 * | 7/2012 | Liu et al. | 372/36 |

FOREIGN PATENT DOCUMENTS

| | | |
|---|---|---|
| JP | 9246658 A | 9/1997 |
| JP | 200256563 A | 2/2002 |
| JP | 200517608 A | 1/2005 |
| JP | 201048971 A | 3/2010 |

OTHER PUBLICATIONS

Office Action mailed Aug. 13, 2013, corresponding to Japanese patent application No. 2012-107012.

Office Action mailed Dec. 3, 2013, corresponding to Japanese patent application No. 2012-107012.

* cited by examiner

SEMICONDUCTOR LASER MODULE

RELATED APPLICATIONS

The present application is a continuation of International Application Number PCT/JP2013/053624, filed Feb. 15, 2013, which claims priority from Japanese Application Number 2012-107012, filed May 8, 2012, the disclosures of which application are hereby incorporated by reference herein in their entirety.

TECHNICAL FIELD

The present invention relates to a semiconductor laser module that shows high fiber optic coupling efficiency.

BACKGROUND ART

Semiconductor laser modules, which couple lights emitted from multiple semiconductor lasers to an optical fiber, have been known. As such semiconductor laser modules, for example, a laser diode assembly is known, wherein multiple lasers, along with lenses and mirrors that correspond to these, are arranged in the height direction on multiple steps (Patent Document 1).

RELATED ART DOCUMENT

Patent Documents

[Patent Document 1] U.S. Pat. No. 7,733,932

SUMMARY OF THE INVENTION

Problem to be Solved by the Invention

Figure 11:
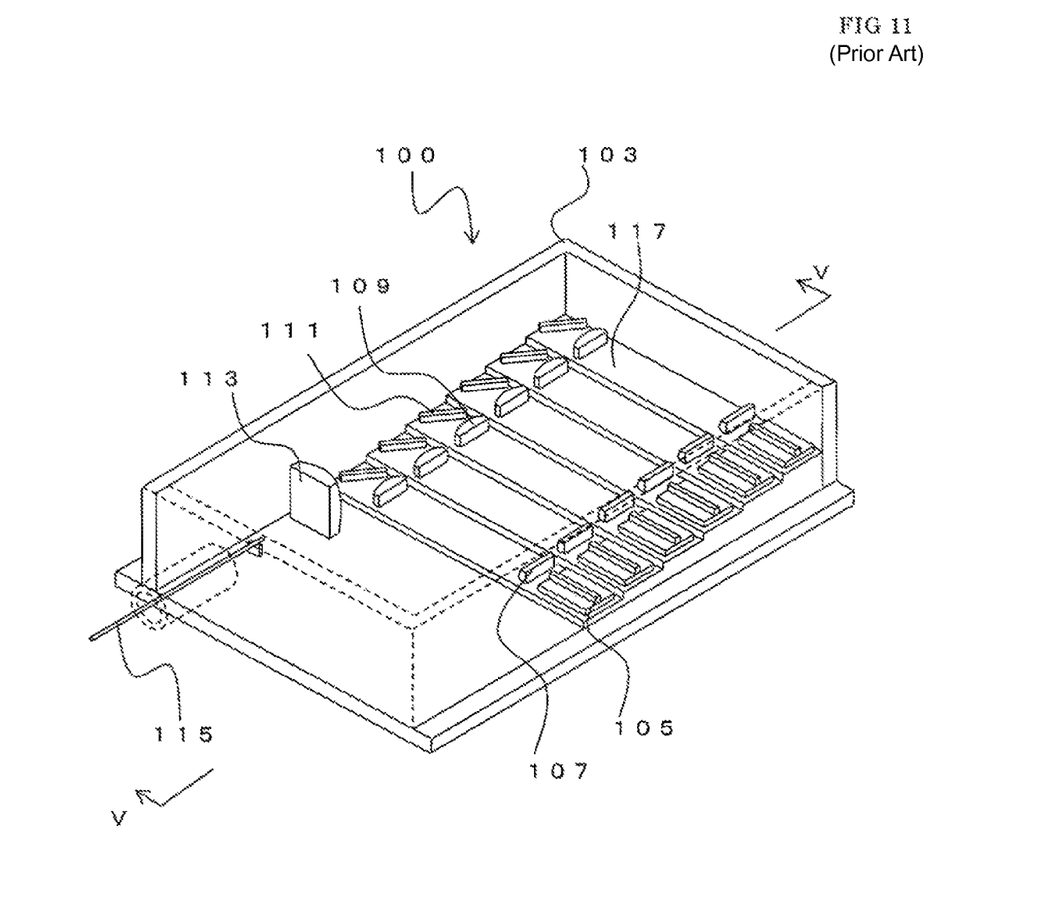
FIG. 11 is a perspective view that shows the semiconductor laser module 100.

FIG. 11 is a schematic diagram that shows a conventional semiconductor laser module 100. Note that FIG. 11 is a perspective view in which the package 103 is seen through from the top surface and the side wall facing the front in the figure. The semiconductor laser module 100 is mainly composed of a package 103, semiconductor lasers 105, lenses 107, 109, 113, reflecting mirrors 111, an optical fiber 115, and the like.

The bottom part of the package 103 is formed in a step-like shape, so that its height gradually increases. Each step becomes the semiconductor laser installation surface 117. The semiconductor laser 105 is installed on each semiconductor laser installation surface 117.

A lens 107 is arranged at the anterior (in the emission direction) of the semiconductor laser 105. Additionally, a lens 109 is arranged further to the anterior. The longitudinal direction and the lateral direction of the light emitted from the semiconductor laser 105 are each collimated by the lenses 107, 109.

The light collimated in this manner is reflected by the reflecting mirror 111 and its direction is changed to an approximately vertical direction. Note that the lenses 107, 109 and the reflecting mirror 111 are arranged for each semiconductor laser 105 and are arranged on the same semiconductor laser installation surface. Further, the light reflected by each reflecting mirror 111 is concentrated by a lens 113 and coupled to the optical fiber 115.

Figure 12A:
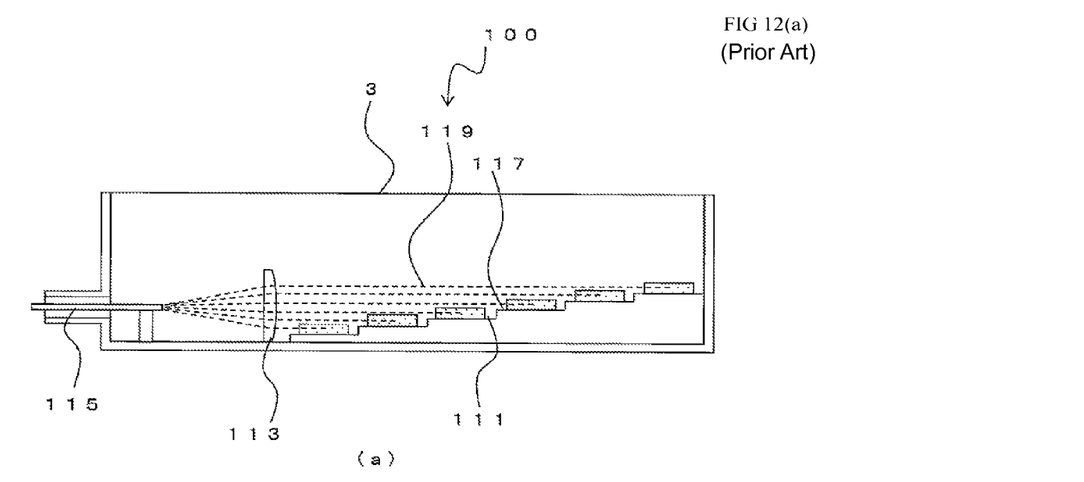

FIG. 12(a) is a side view of the semiconductor laser 105 in the emission direction, and a sectional diagram at the V-V line in FIG. 11. As described above, the laser lights 119 emitted from each semiconductor laser 105 (not shown in the figure) are reflected by the reflecting mirrors 111. That is the laser lights 119 emitted from each of the semiconductor lasers 105 are emitted at different heights and reflected by reflecting mirrors 111 arranged at different heights. The lens 113 can couple these laser lights 119 of various heights to the optical fiber 115 by concentrating them.

Figure 12B:
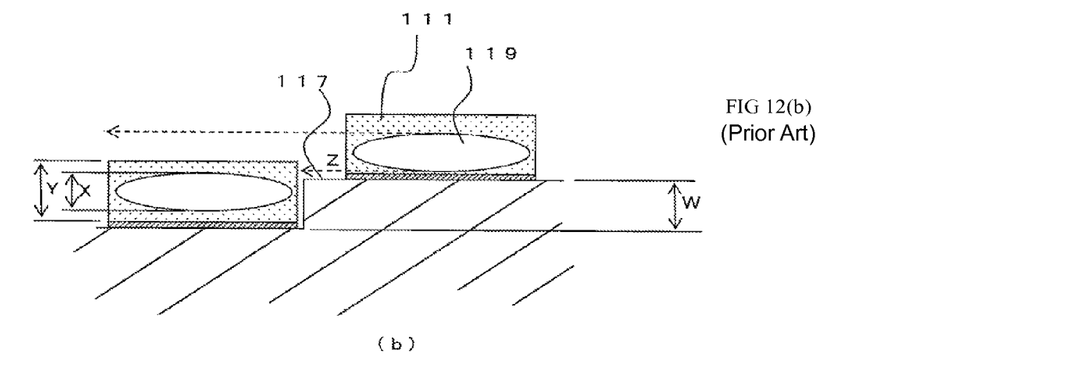

FIG. 12(b) is an enlarged view of the vicinity of the reflecting mirror 111 in such a situation. At each of the reflecting mirrors 111 at the bottom step side (left side in the figure) and the top step side (right side in the figure), the laser lights 119 are reflected. Here, the height of the reflecting mirror 111 (Y in the figure) is about 1000 μm, but the difference in height of the step of the semiconductor laser installation surfaces 117 (W in the figure) is about 300 μm. Thus, the height of the area that the laser light 119 can irradiate on the mirror is 300 μm. Further, the height of the laser light 119 (X in the figure) is about 250 μm. Thus, for all of the laser lights 119 to irradiate the reflecting mirror 111, without hitting the laser light 119 reflected from the mirror on the bottom step, there is only about 25 μm of allowance above and below the reflecting mirror 111.

Here, the reflecting mirror 111 is fixed on the semiconductor laser installation surface 117 with an adhesive, or the like. Thus, the reflecting mirror 111 moves in the vertical direction in the adhesive's fixing accuracy of +20 μm−5 μm. Further, as the processing accuracy of the reflecting mirror 111, there is a tolerance of about ±30 μm. Thus, depending on the variance in the thickness of the adhesive or when the processing accuracy deviates to the larger side, the reflecting mirror 111 on the bottom side may shift upward up to 50 μm from the designed value.

When the reflecting mirror 111 on the bottom side protrudes upward, in this manner, part of the laser light 119 that is reflected by the reflecting mirror 111 on the top side may be covered by the reflecting mirror 111 on the bottom side (arrow Z in the figure). That is, part of the laser light 119 may not be reflected toward the direction of the optical fiber 115.

However, it is difficult to move the reflecting mirror 111 on the bottom side toward the bottom any further. Moreover, setting a stricter dimensional accuracy for the reflecting mirror 111 may lead to an increase in cost. Further, if the size of the reflecting mirror 111 is made smaller, as described previously, the margin of the laser light 119 with respect to the size becomes smaller, and reflection of the entire laser light 119 becomes difficult. Furthermore, if the height variable of the steps is made larger, the difference in the height direction for laser light 119 becomes large, requiring a larger lens 113 and making light concentration to the optical fiber 115 more difficult.

The present invention was made in view of such problems, and its object is to provide a semiconductor laser module, in which laser light is definitely reflected by the reflecting mirror, and which shows high fiber optic coupling efficiency Means for Solving the Problems In order to attain the above described object, the present invention is a semiconductor laser module comprising: a plurality of semiconductor lasers; a plurality of reflecting mirrors, which each reflect laser lights emitted from the plurality of semiconductor lasers; a condensing lens, which concentrates the laser lights reflected by the plurality of reflecting mirrors and couples them to an optical fiber; wherein the plurality of semiconductor lasers are each arranged on semiconductor laser installation surfaces of different heights; and the plurality of reflecting mirrors are each joined at different heights on an erect surface, which is approximately vertical to the semiconductor laser installation surface.

The erect surface is preferably a surface that faces the emission surface of the semiconductor laser.

It is preferable that the reflecting mirror comprises a grasping part for grasping the reflecting mirror for installation, and the grasping part comprises two surfaces that are parallel to each other and approximately vertical to the erect surface, and the reflective surface of the reflecting mirror is formed at a given angle with respect to the grasping part.

The bond surface of the reflecting mirror on the erect surface may be composed of a curved surface. A concaved part may be formed on a bond part of the erect surface to the reflection mirror.

The erect surface may be the inner surface of the package of the semiconductor laser module. Alternatively, the erect surface may be arranged inside the package of the semiconductor laser module, and may be a wall member that is provided above the semiconductor laser installation surface. In such a case, the wall member may be composed of a material that is the same as the material composing the semiconductor laser installation surface, or the wall member may be composed of a material that is the same as the material composing the reflecting mirror.

According to the present invention, the reflecting mirror is installed on an erect surface vertical to the semiconductor laser installation surface. Thus, there is no fluctuation in the height direction caused by the thickness of the adhesive etc.

Further, because the reflecting mirror is fixed on an erect surface, the reflecting mirror can be made as thin as the beam width of the laser light 119 in the vertical direction. Here, the fixing position of the reflecting mirror in the height direction can be adjusted arbitrarily. Thus, the reflecting mirror can be installed at the appropriate position with respect to the laser light. For this reason, even when the margin of the reflecting mirror with respect to the size of the laser light is made small, it can be adequately applied.

Further, by forming a grasping part on the reflecting mirror, fine adjustment can be made on the fixing position of the reflecting mirror in accordance with a specified device by grasping the grasping part. Thus, the installation position accuracy of the reflecting mirror can be enhanced.

Further, by making the bond surface between the reflecting mirror and the erect surface a curved surface, adjustment of the direction etc. of the reflecting mirror becomes easy. For example, by performing fine adjustment on the direction of the reflecting mirror while part of the convexed part of the reflecting mirror is in contact with the erect surface, the arrangement and direction of the reflecting mirror can be accurately adjusted.

Furthermore, by having a concaved part on part of the erect surface, the reflecting mirror can be fixed by installing to the concaved part, thereby preventing the adhesive from spilling to the bottom part etc. of the package.

Further, by using the inner surface of the package as the erect surface, a conventional package can be used as it is. Thus, the structure becomes simple.

Furthermore, a separate wall member can be used as the erect surface. In such a case, because the member differs from the package, it is not affected by deformation of the package etc. Thus, deviation of the optical axis of the reflecting mirror can be avoided.

Further, in such a case, by using the same material as the material composing the semiconductor laser installation surface for the wall member, the effect of the deviation of the optical axis etc. due to the difference in thermal expansion can be suppressed.

Furthermore, by using the same material as the material composing the reflecting mirror for the wall member, adhesion becomes easy. Further, the effect of the deviation of the optical axis etc. due to the difference in thermal expansion of the reflecting mirror and the wall member can be suppressed.

Advantageous Effect of the Invention

According to the present invention, a semiconductor laser module that definitely reflects laser light by the reflecting mirror and shows superior fiber optic coupling efficiency can be provided.

BRIEF DESCRIPTION OF THE DRAWINGS

FIG. 3 (*a*) is a side view that shows the semiconductor laser module 1 at the A-A line in FIG. 2.

FIG. 3 (*b*) is an enlarged view in the vicinity of the reflecting mirror.

FIG. 4 (*a*) is a conceptual diagram that shows the shape of the laser light and is the shape at the B-B line cross section in FIG. 3 (*a*).

FIG. 4 (*b*) is a conceptual diagram that shows the shape of the laser light and is the shape at the C-C line cross section in FIG. 3 (*a*).

FIG. 5 (*a*) is a diagram that shows the shape of the reflecting mirror 11.

FIG. 5 (*b*) is a diagram that shows the shape of the reflecting mirror 11*a*.

FIG. 6 (*a*) is a diagram that shows the shape of the reflecting mirror 11*b*.

FIG. 6 (*b*) is a diagram that shows the shape of the reflecting mirror 11*c*.

FIG. 12 (*a*) is a side view that shows the semiconductor laser module 100 and is a V-V line sectional view of FIG. 11.

FIG. 12 (*b*) is an enlarged view of the vicinity of the reflecting mirror.

DESCRIPTION OF PREFERRED EMBODIMENTS OF THE INVENTION

Figure 1:
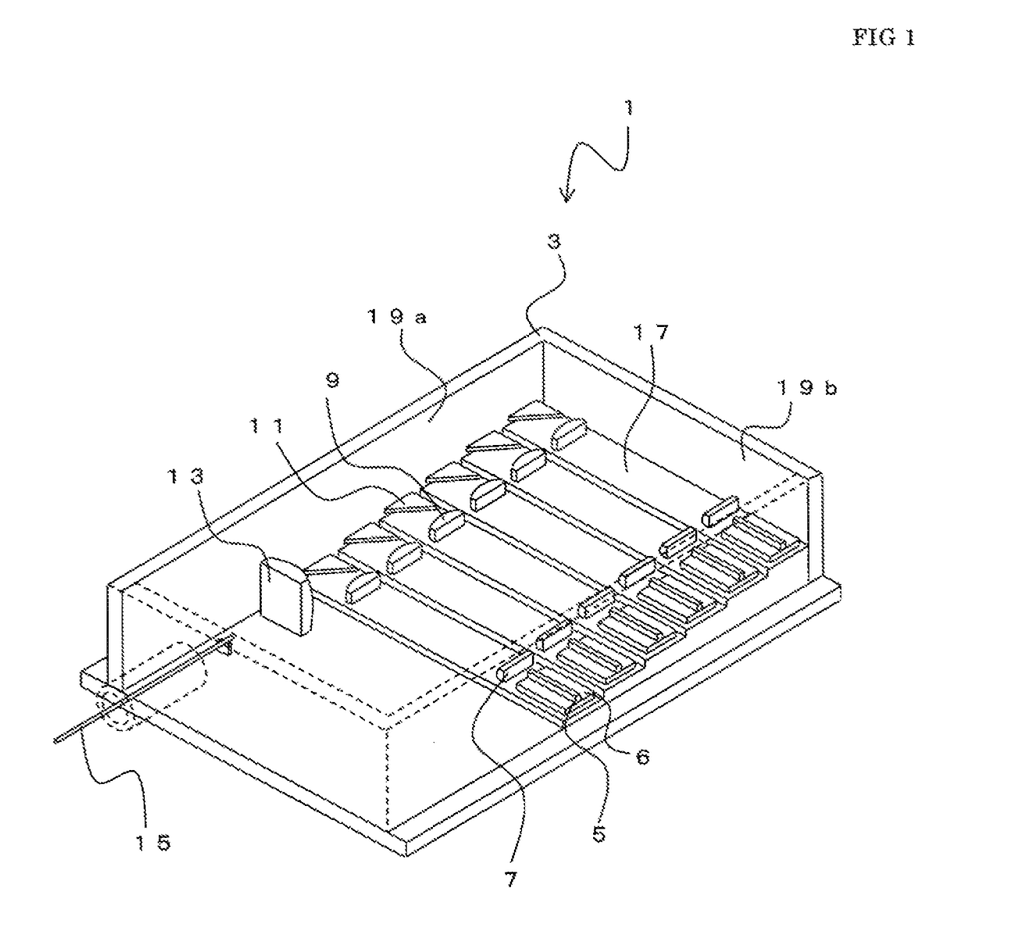
FIG. 1 is a perspective view that shows the semiconductor laser module 1.
Figure 2:
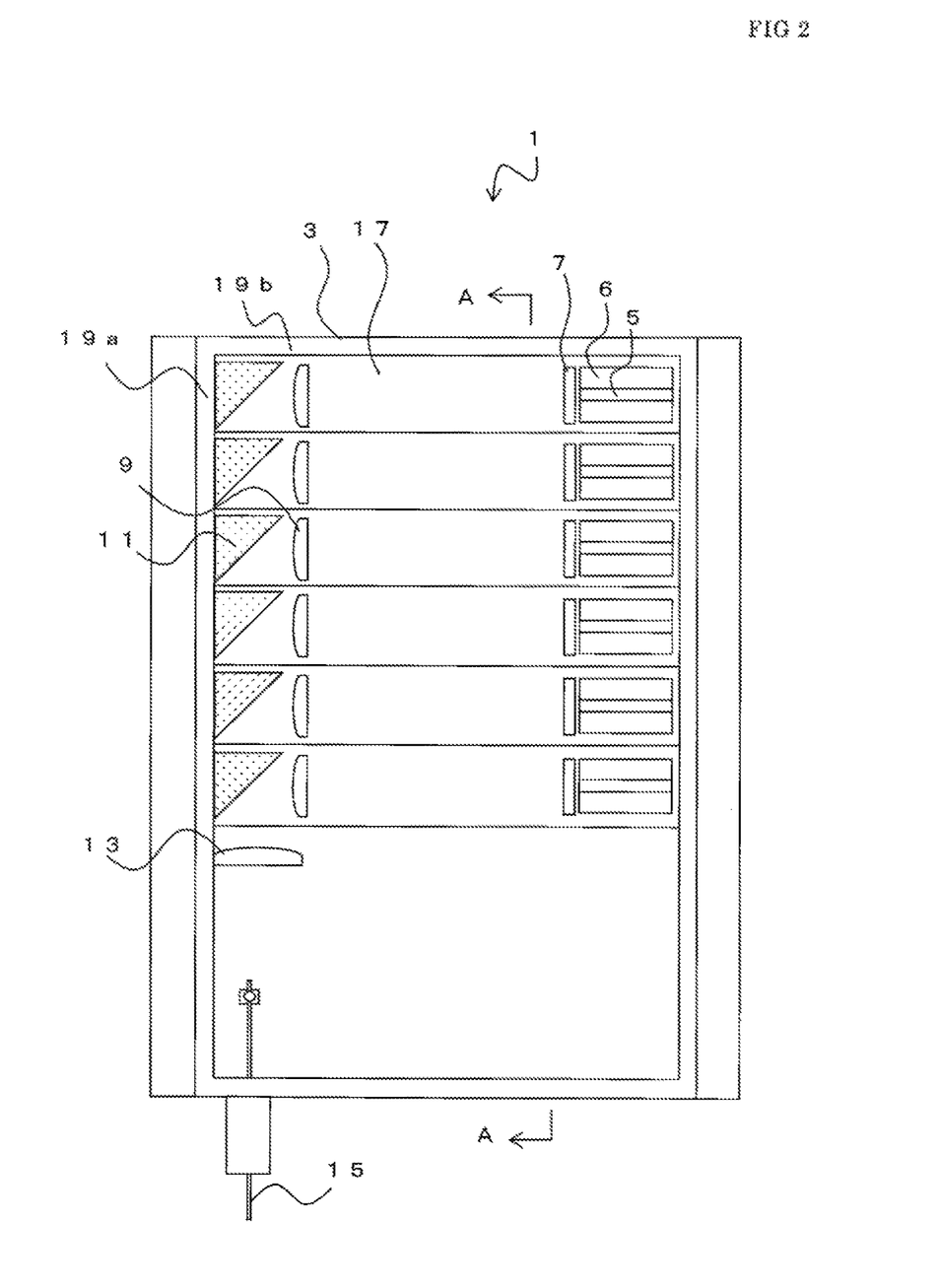
FIG. 2 is a top view that shows the semiconductor laser module 1.

Hereinafter, embodiments of the present invention will be described in detail with reference to the accompanying figures. FIG. 1 is a diagram that shows the semiconductor laser module 1 and FIG. 1 is a perspective view and FIG. 2 is a top view. Note that FIG. 1 is a diagram in which the package 3 is seen through from the top surface and the side wall facing the front in the figure. The semiconductor laser module 1 is mainly composed of a package 3, semiconductor lasers 5, lenses 7, 9, 13, reflecting mirrors 11, an optical fiber 15, and the like.

The package 3 is composed of a bottom part and side surfaces 19*a*, 19*b*. The side surfaces 19*a*, 19*b* are erected with respect to the bottom part of the package 3 in an approximately vertical manner. Further, side surfaces 19*a*, 19*b* are arranged vertically to each other. Note that the side surfaces 19a, 19b are composed of, for example, copper, copper alloy, Fe—Ni—Co alloy, aluminum, or resin. Further, the bottom part of the package 3 is composed of, for example, copper, copper alloy, aluminum, ceramic that show high thermal conductivity (such as aluminum nitride: AlN, beryllium oxide: BeO), and the like.

Within the package 3, the bottom part is formed in a step-like shape so that its height gradually increases. Each platform of the step becomes the semiconductor laser installation surface 17. That is, in the semiconductor laser module 1, multiple semiconductor laser installation surfaces 17 are formed in a step-like shape. The semiconductor lasers 5 are installed on each of the semiconductor laser installation surfaces 17. The semiconductor lasers 5 may be loaded on a sub-mount 6 in advance, and the sub-mount 6 with the semiconductor laser 5 mounted thereon (chip-on sub-mount: COS) may be installed on to the semiconductor laser installation surfaces 17.

A lens 7 is arranged at the anterior (the emission direction) of the semiconductor laser 5. Although the figure, it is provided separately from the semiconductor laser 5, it may be provided on the emission end surface. Furthermore, a lens 9 is arranged further to the anterior. The lenses 7, 9 are arranged for each semiconductor laser 5 on the same semiconductor laser installation surfaces 17. The lenses 7, 9 collimate the light emitted from the semiconductor laser 5 in the longitudinal and lateral direction. The lens 7 may be fixed on the wall surface of the sub-mount 6 after adjusting its height with the semiconductor laser 5.

A reflecting mirror 11 is fixed on the side surface 19a, which is provided so that it faces the emission direction of the semiconductor laser 5. The side surface 19a, which is an erect surface with respect to the semiconductor laser installation surface 17, is approximately vertical to the semiconductor laser installation surface 17 and composes the side wall of the package 3. The reflecting mirror 11 reflects the light collimated by the lenses 7, 9 in an approximately vertical direction. Note that the lenses 7, 9 and reflecting mirrors 11 for each of the semiconductor lasers 5 may all be of the same shape.

A lens 13 is fixed on the bottom part of the package 3 facing a direction vertical to the emission direction of the semiconductor laser 5. The lens 13 is for concentrating the laser light reflected by the reflecting mirror 11. Further, an optical fiber 15 is provided at the back side of the lens 13 so that it penetrates the package 3. The laser light concentrated by the lens 13 is coupled to the optical fiber 15.

That is, as shown in FIG. 2, a plurality of semiconductor lasers 5 are placed on the semiconductor laser installation surfaces 17 of various heights, and emit laser light toward approximately the same direction. In the emission direction of the semiconductor laser 5, the lenses 7, 9 and the reflecting mirror 11 are arranged successively in the same direction. Thus, the laser light is irradiated on the reflecting mirror 11 via the lenses 7, 9. Further, at each reflecting mirror 11, the laser lights are reflected toward approximately the same direction. The laser lights reflected by each of the reflecting mirrors 11 are concentrated by the lens 13 and coupled to the optical fiber 15. Note that when a double lens system is used, it is convenient to arrange the lens that collimates the direction horizontal to the integration direction of the semiconductor laser 5 on the side of the semiconductor laser 5, and arrange the lens that collimates the direction vertical to the integration direction of the semiconductor laser 5 on the mirror side.

Further, the number and arrangement of the semiconductor laser 5 is not limited to the example shown in the figure. Furthermore, the lenses 7, 9 are not necessarily needed if the reflective surface of the reflecting mirror 11 is formed of a curved surface or a spherical surface and the expanse of the laser light emitted from the semiconductor laser 5 in the longitudinal or lateral direction can be collimated by the reflecting mirror 11.

Figure 3A:
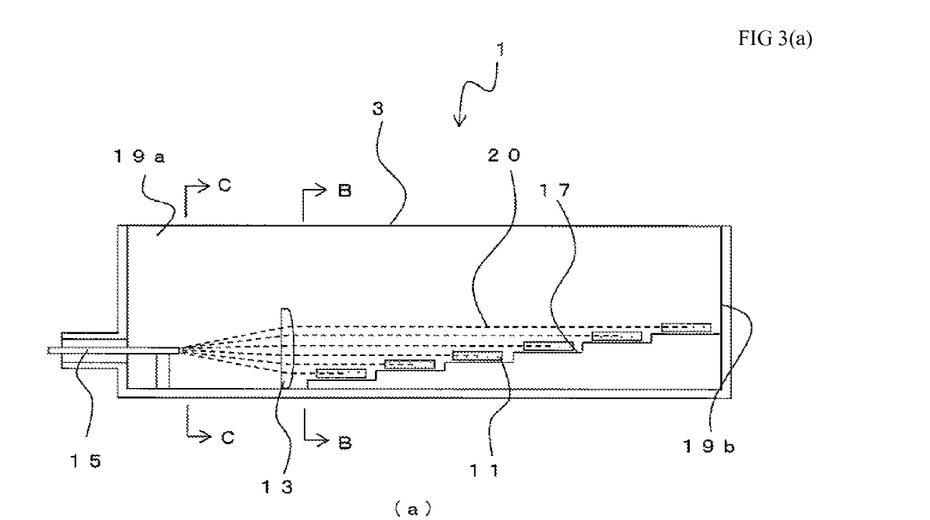

FIG. 3(a) is a side view of the semiconductor laser 5, and a cross-sectional view of the A-A line in FIG. 2. As described previously, the laser lights 20 emitted from each semiconductor laser 5 (not shown in the figure) are reflected by the reflecting mirrors 11. That is, the laser lights 20 emitted from each semiconductor laser 5 are emitted at different heights and reflected by the reflecting mirrors 11 arranged at different heights.

Figure 4A:
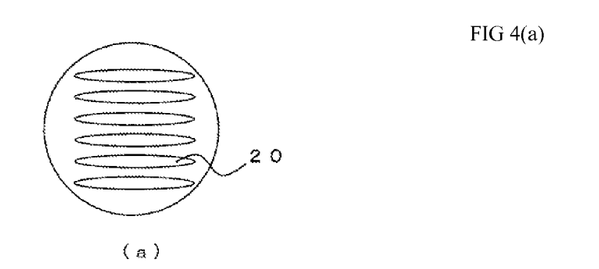
Figure 4B:
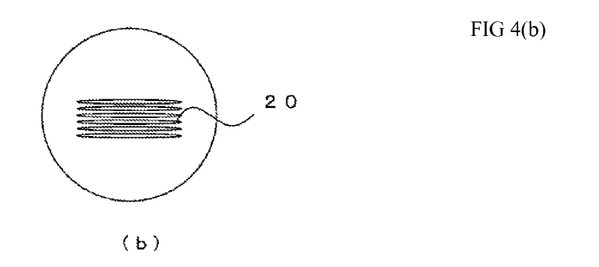

FIG. 4(a) is a conceptual diagram that shows the shape of the laser light at the B-B line cross section in FIG. 3(a), and FIG. 4(b) is a conceptual diagram that shows the shape of the laser light at the C-C line cross section in FIG. 3(a).

As shown in FIG. 4(a), before entering the lens 13, the laser lights 20 reflected by each reflecting mirror 11 pass different heights depending on the height of the semiconductor laser installation surfaces 17. Meanwhile, by entering the lens 13, the laser lights 20 are concentrated in the height direction with the focal point at the position of the end surface of the optical fiber 15. That is, the lens 13 can couple the laser lights 20 of different heights to the optical fiber 15 by concentrating them.

Figure 3B:
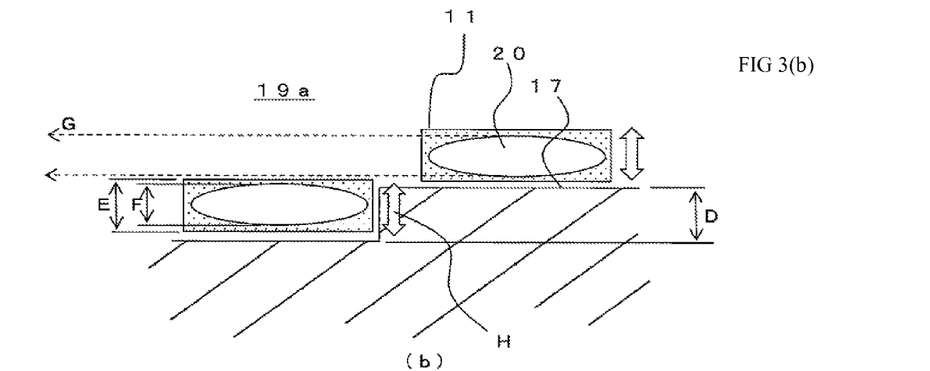

FIG. 3(b) is an enlarged view of the vicinity of the reflecting mirror 11. At each of the reflecting mirrors 11 in the bottom side (left side in the figure) and the top side (right side of the figure), the laser lights 20 are reflected. Here, the height of the laser light 20 (F in the figure) is about 250 μm. Thus, the thickness of the reflecting mirror 11 (E in the figure) only has to be slightly larger than this. For example, it may be 250 μm or larger and 300 μm or smaller. Further, the difference in height of the semiconductor laser installation surfaces 17 (D in the figure) is about 300 μm.

Here, as shown in FIG. 2, the reflecting mirrors 11 are fixed to the side surface 19a by an adhesive etc. That is, the reflecting mirrors 11 are never adhered to the semiconductor laser installation surfaces 17. Thus, a gap can be formed between the bottom surface of the reflecting mirror 11 and the semiconductor laser installation surfaces 17. Hence, the reflecting mirror 11 is highly flexible in terms of its adjustment in the height direction (the direction of arrow H in the figure).

In particular, as described previously, a conventional reflecting mirror 111 (FIG. 12(b)) is installed on the semiconductor laser installation surface 117. For this reason, a reflecting mirror 111 is arranged at the bottom part, to which laser light is not actually irradiated. In contrast, in the present invention, the reflecting mirrors 11 are fixed on the side surface 19a. Thus, the installation height can easily be adjusted. Hence, even when its height is almost equal to the height of the laser light 20, it can definitely reflect the laser light 20.

In this manner, by adjusting the height of the reflecting mirrors 11, obstruction of the laser light 20 in the higher step side (arrow G in the figure) can easily be prevented. Needless to say, the height of the reflecting mirror 11 on the higher step side can easily be adjusted too.

Note that the adhesion surface of the reflecting mirror 11 is not the bottom surface of the reflecting mirror 11 but the side surface. Thus, when an ultraviolet-curing adhesive is used for adhesion of the reflecting mirror 11, the arm etc. for grasping the reflecting mirror 11 does not shadow the ultraviolet irradiation. Therefore, if the ultraviolet ray is irradiated diagonally from the top of the reflecting mirror 11, the ultraviolet ray can easily be irradiated on the adhesion surface. That is, irradiation of ultraviolet ray on the adhesion surface of the reflecting mirror 11 is easy.

Figure 5A:
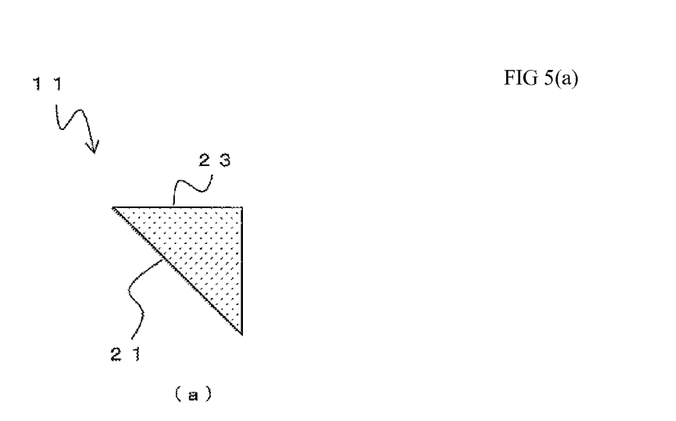

Next, the reflecting mirror 11 will be described in detail. FIG. 5(a) is a top view that shows the reflecting mirror 11. The reflecting mirror 11 is composed of a bond surface 23 that is fixed to the side surface 19a and a reflective surface 21 that is formed in a 45° angle with respect to it. The reflecting mirror 11 is, for example, made of glass, and a thin film of dielectric multilayer or metal etc. is formed on the reflective surface 21.

Figure 5B:
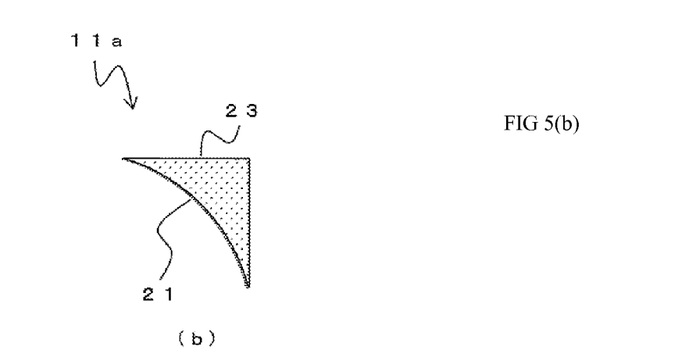

Note that a reflecting mirror 11a as shown in FIG. 5(b) can be utilized, too. The reflective surface 21 of the reflecting mirror 11a is composed of a concaved curved surface. By using such a reflecting mirror 11a, the laser light can be concentrated in a desired form.

Figure 6A:
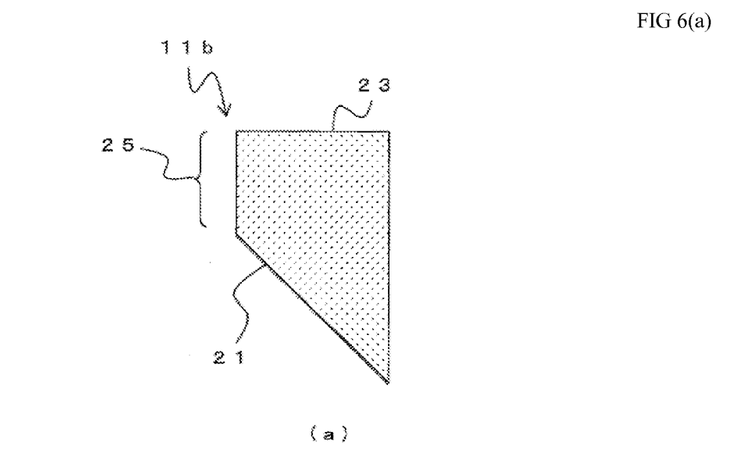

Further, as shown in FIG. 6(a), a reflecting mirror 11b comprising a grasping part 25 can also be utilized. The grasping part 25 is approximately vertical to the bond surface 23 (surface that is to be joined) and consists of two parallel surfaces facing one another. By forming a grasping part 25, the reflecting mirror 11b can be held by, for example, an arm etc., which is abbreviated from the figure. Thus, when the reflecting mirror 11b is joined to the side surface 19a, fine adjustment of the position and direction of the reflecting mirror 11b becomes easy.

Figure 6B:
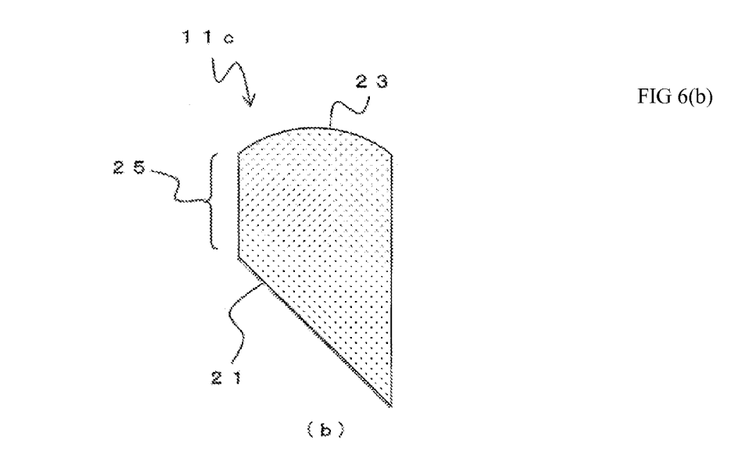

Further, as shown in FIG. 6(b), a reflecting mirror 11c, wherein the bond surface 23 is composed of a curved surface, can also be used. Note that the curved surface of the bond surface 23 may be a curved surface in one cross sectional direction, or may be a spherical surface. By doing so, the direction, etc. of the reflecting mirror 11c can be easily adjusted while part of the bond surface 23 is in contact with the side surface 19a etc., when joining the reflecting mirror 11c to the side surface 19a. Thus, fine adjustment of the direction of the reflecting mirror 11c becomes easy.

As described above, according to the present embodiment, the reflecting mirror 11 etc. are fixed on an erect surface that is approximately vertical to the semiconductor laser installation surfaces 17. For this reason, the adjustment of height with respect to the semiconductor laser installation surfaces 17 becomes easy. Thus, no particular semiconductor laser is covered by the reflecting mirror(s) etc. for the laser light of other height(s). Further, even when shrinkage occurs during curing of the adhesive, positional deviation in the height direction of the reflecting mirror 11 etc, does not occur. Hence, a semiconductor laser module of high coupling efficiency can be obtained.

Further, because the erect surface is the side surface 19a of the package 3, the structure is simple. Further, because reflecting mirrors of the same shape can be utilized, it is also superior in production cost. Further, as with reflecting mirrors 11b, 11c, by having a grasping part 25, fine adjustment of the reflecting mirror becomes even easier.

Figure 7:
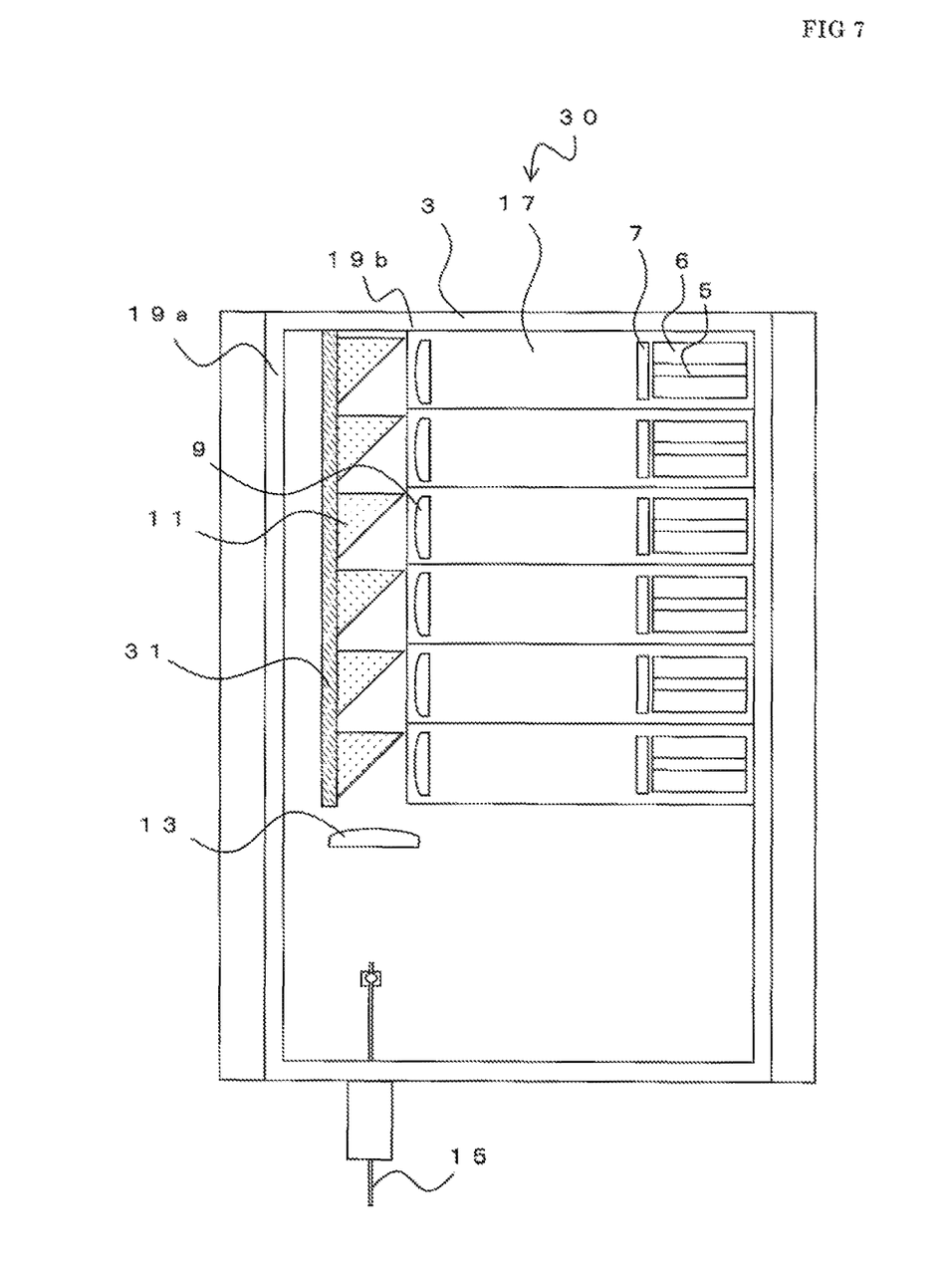
FIG. 7 is a top view that shows the semiconductor laser module 30.

Next, another embodiment will be described. FIG. 7 is a top view that shows the semiconductor laser module 30. Note that in the following description, compositions that show the same functions as those of semiconductor laser module 1 are denoted by the same notations as those in FIG. 1 to FIG. 3 (a) and FIG. 3 (b), and redundant descriptions are abbreviated. The semiconductor laser module 30 shows similar compositions as those of the semiconductor laser module 1, but differ in that it utilizes a wall member 31. Note that, although in the following description, an example that uses reflecting mirror(s) 11 is described, it goes without saying that other forms of the reflecting mirrors 11a, 11b, 11c may also be used.

In the semiconductor laser module 30, the shape of the steps in the semiconductor laser installation surfaces 17 at the bottom part of the package 3 are formed to the position of lens 9. At the back side of the lens 9, a wall member 31 is installed so that it covers the entire installation range of the semiconductor laser 5. That is, the wall member 31 is fixed on the flat part of the bottom part of the package 3. Thus, the wall member 31 is erect at an approximately vertical manner with respect to the semiconductor laser installation surfaces 17, and is provided approximately parallel to the side surface 19a.

The reflecting mirror 11 is fixed at a height corresponding to the height of each semiconductor laser 5 with respect to the wall member 31. That is, the reflecting mirror 11 is fixed at various heights with respect to the wall member 31. Note that the method of fixing the reflecting mirrors 11 and their arrangement are the same as those for the semiconductor laser module 1.

The wall member 31 may be composed of, for example, the same material as that of the bottom part of the semiconductor laser module 30. As described previously, the bottom part of the semiconductor laser module 30 is composed of copper, copper alloy, aluminum, ceramic that show high thermal conductivity (such as aluminum nitride: AlN, beryllium oxide: BeO), and the like. Thus, by composing the wall member 31 with the same material as the bottom part, the bottom part and the wall member 31 will have approximately the same linear expansion coefficients. Hence, the effect of distortion etc. due to thermal change etc. can be made small.

Further, the wall member may be composed of, for example, the same material as that of the reflecting mirrors 11. As described previously, the reflecting mirror 11 is made of glass. Thus, by composing the wall member 31 with the same material as the reflecting mirror 11, its adhesive property with the reflecting mirror 11 becomes good. Hence, adhesion of the reflecting mirror 11 with the wall member 31 becomes easy.

As described above, according to the semiconductor laser module 30, the same effects as those for the semiconductor laser module 1 can be obtained. Further, by arranging the wall member 31 to which the reflecting mirror 11 is fixed separately from the package 3, the material of the wall member 31 can be made different from the material of the side surface 19a. Thus, the material can be selected arbitrarily by taking in consideration the distortion due to thermal change and its adhesive property with the reflecting mirror 11 etc.

Figure 8:
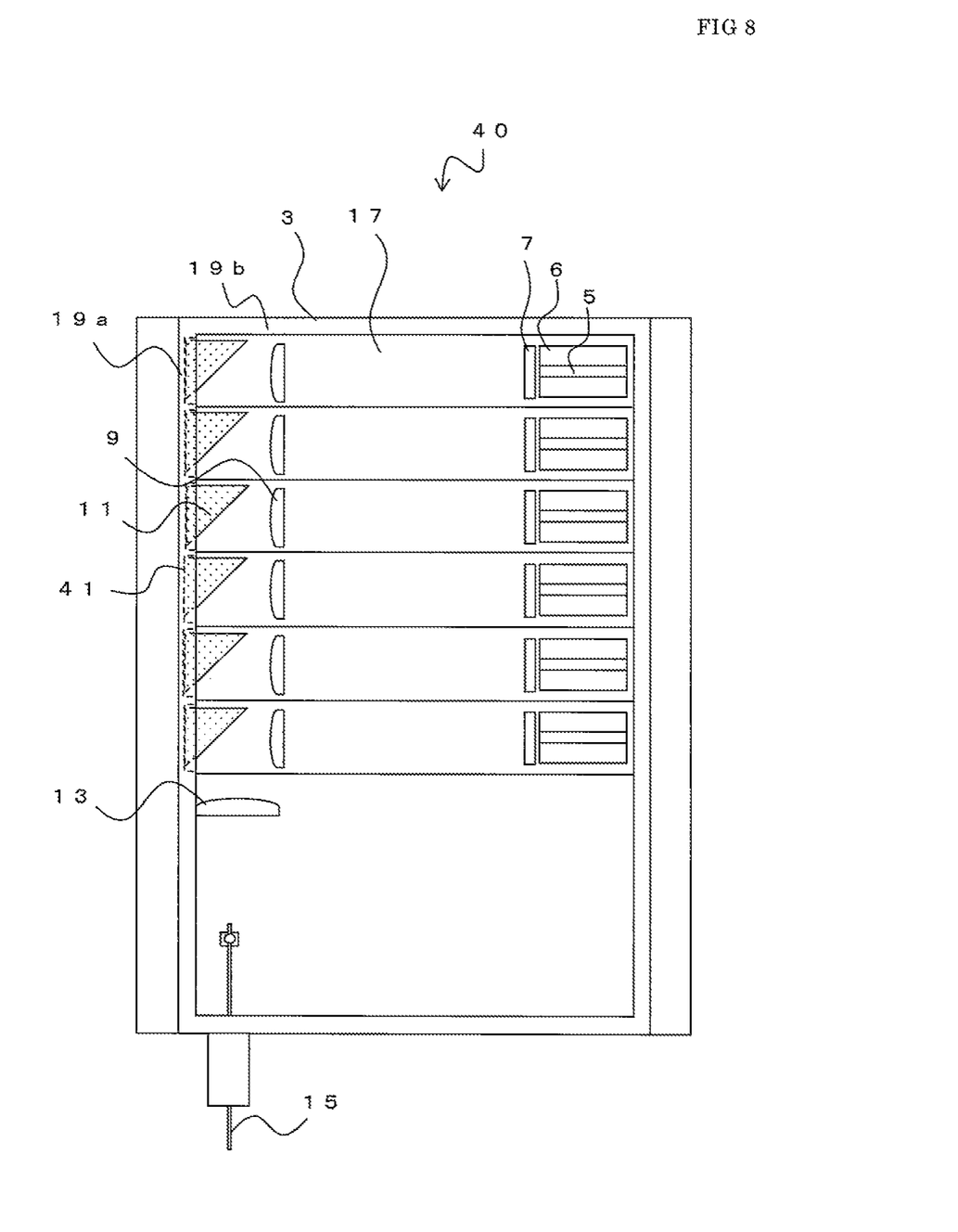
FIG. 8 is a top view that shows the semiconductor laser module 40.

Next, yet another embodiment will be described. FIG. 8 is a top view that shows the semiconductor laser module 40. The semiconductor laser module 40 shows similar compositions as those of the semiconductor laser module 1, but differ in that a concaved part 41 is formed on the side surface 19a.

At the part of the side surface 19a, to which the reflecting mirror 11 is fixed, a concaved part 41 is formed. The concaved part 41 is a cavity formed on the side surface 19a, and the reflecting mirror 11 is fixed inside the concaved part 41.

By having a concaved part 41, the adhesive used at the adhesion part between the reflecting mirror 11 and the side surface 19a can be prevented from flowing down on the bottom part of the package 3. Thus, adherence of the adhesive on the bottom part of the package 3 and the lens etc. can be prevented. Note that the concaved part 41 may be formed on the aforementioned wall member 31.

Figure 9:
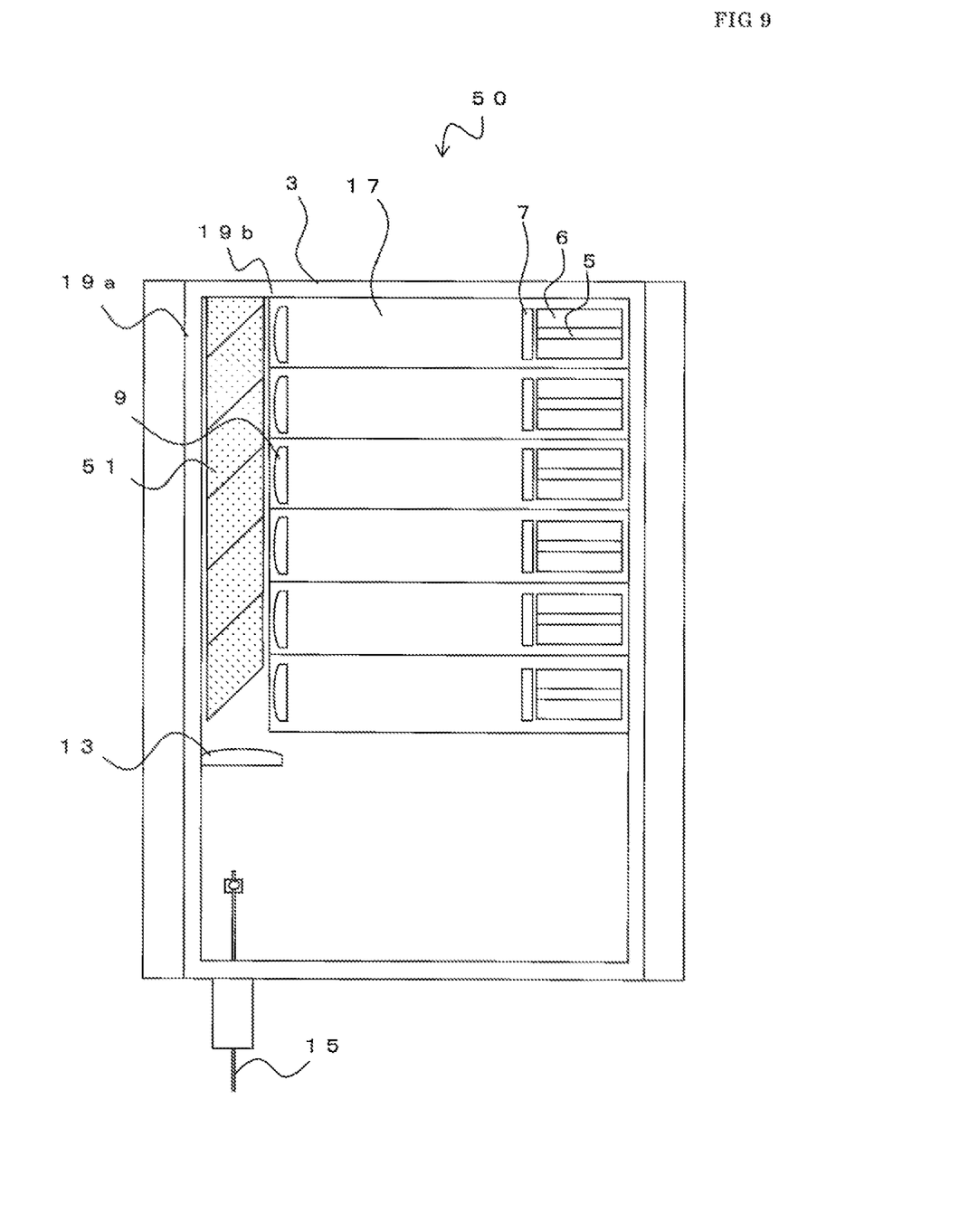
FIG. 9 is a top view that shows the semiconductor laser module 50.
Figure 10:
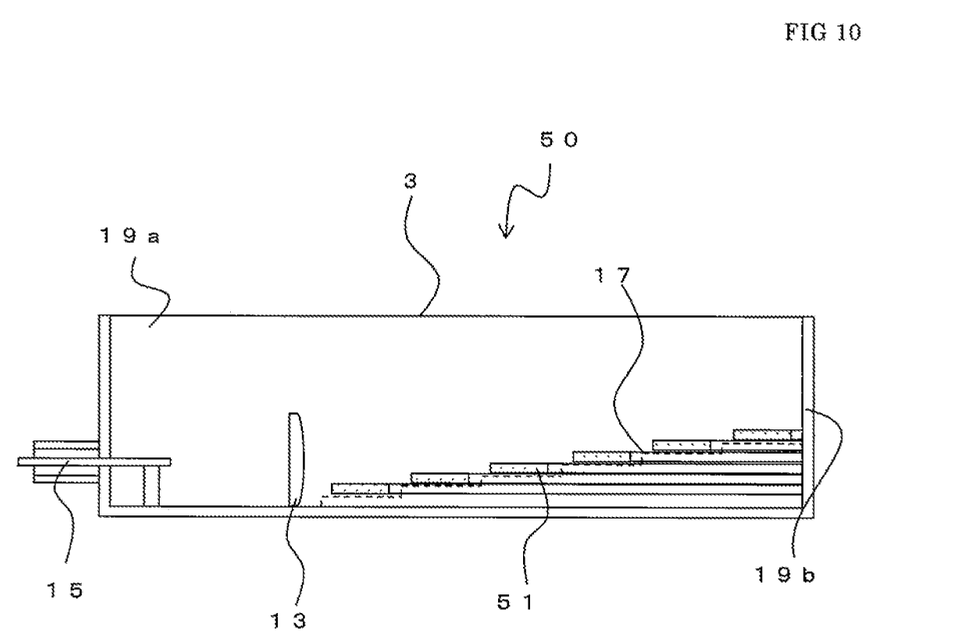
FIG. 10 is a sectional side view that shows the semiconductor laser module 50.

Next, yet another embodiment will be described. FIG. 9 is a top view that shows the semiconductor laser module 50, and FIG. 10 is a cross sectional side view. The semiconductor laser module 50 shows similar compositions as those of semiconductor laser module 1, but differ in that a reflecting mirror 51 is provided and in the adhesion surface of the reflecting mirror 51.

In the semiconductor laser module 50, a reflecting mirror 51 is utilized. The reflecting mirrors 51 differ in length depending on each corresponding semiconductor laser 5. For example, as shown in FIG. 10, the longest reflecting mirror 51 may be fixed on the lowest position and shorter reflecting mirrors 51 may be fixed sequentially as the position moves upward.

The reflecting mirror 51 is fixed on a side surface 19b that is approximately vertical to the side surface 19a. As with the side surface 19a, the side surface 19b of the package 3 is also an approximately vertical erect surface with respect to the semiconductor laser installation surface 17.

A slight clearance may be formed between the reflecting mirrors 51, or they may be in contact. Because the reflecting mirrors 51 are not fixed to the semiconductor laser installation surfaces 17 even in the case of semiconductor laser module 50, adjustment in the height direction becomes easy.

Although preferred embodiments of the present invention have been described above based on their typical sizes with reference to the accompanying figures, the present invention is not affected by such examples. It should be obvious to those in the field that examples of various examples of changes and modifications are conceivable within the realm of the technical idea disclosed in the present specification, and it should be understood that such examples are justifiably included in the technical scope of the present invention.

For example, each of the above-described embodiments may be used in combination. Further, the form of the reflective surface of the reflecting mirror(s) and the shape of the lens(es) may be suitably set. Furthermore, compositions such as filters may be installed as necessary.

DESCRIPTION OF NOTATION 1, 30, 40, 50 . . . semiconductor laser module
3 . . . package
5 . . . semiconductor laser(s)
6 . . . sub-mount(s)
7 . . . lens(es)
9 . . . lens(es)
11, 11a, 11b, 11c, 51 . . . reflecting mirror(s)
13 . . . lens
15 . . . optical fiber
17 . . . semiconductor laser installation surface(s)
19a, 19b . . . side surface(s)
20 . . . laser light(s)
21 . . . reflective surface
23 . . . bond surface
25 . . . grasping part
31 . . . wall member
41 . . . concaved part
100 . . . semiconductor laser module
103 . . . package
105 . . . semiconductor laser(s)
107 . . . lens(es)
109 . . . lens(es)
111 . . . reflection mirror(s)
113 . . . lens
115 . . . optical fiber
117 . . . semiconductor laser installation surface(s)
119 . . . laser light(s)

The invention claimed is:

1. A semiconductor laser module comprising:
   a package, which is composed of a bottom part and a side wall erecting with respect to the bottom part;
   a plurality of semiconductor lasers;
   a plurality of reflecting mirrors, which each reflect laser lights emitted from the plurality of semiconductor lasers;
   a condensing lens, which concentrates the laser lights reflected by the plurality of reflecting mirrors and couples them to an optical fiber; wherein
   semiconductor laser installation surfaces are formed in a step-like shape, such that those heights gradually increase with respect to the bottom part;
   each of the plurality of semiconductor lasers is arranged on each of the semiconductor laser installation surfaces of different heights;
   the thickness of each of the plurality of reflecting mirrors is the height of the cross sectional shape of the laser light or larger and the height thereof plus 50 μm or smaller;
   each of the plurality of reflecting mirrors is joined at height corresponding to each of the semiconductor laser installation surfaces on an erect surface, which is approximately perpendicular to the semiconductor laser installation surfaces, in such a way that the laser light reflected by the reflecting mirrors of higher step passes over the reflecting mirrors of lower steps;
   each of the plurality of reflecting mirrors is joined at the erect surface that faces the emission surface of the semiconductor laser; and
   the reflecting mirrors include a grasping part for grasping the reflecting mirrors for installation, and
   respective grasping parts comprise, respectively, two surfaces that are parallel to each other and approximately perpendicular to the erect surface and the semiconductor laser installation surfaces, and
   the reflective surface of the reflecting mirrors are formed at a given angle with respect to the grasping part.

2. The semiconductor laser module according to claim 1, wherein a bond surface of the reflecting mirrors on the erect surface is composed of a curved surface.

3. The semiconductor laser module according to claim 1, wherein a concaved part is formed on a bond part of the erect surface to the reflection mirrors.

4. The semiconductor laser module according to claim 1, wherein the erect surface is the inner surface of the side wall of the package of the semiconductor laser module.

5. The semiconductor laser module according to claim 1, wherein the erect surface is arranged inside the package of the semiconductor laser module, and is a wall member that is provided above the semiconductor laser installation surfaces.

6. The semiconductor laser module according to claim 5, wherein the wall member is composed of a material that is the same as the material composing the semiconductor laser installation surfaces.

7. The semiconductor laser module according to claim 5, wherein the wall member is composed of a material that is the same as the material composing the reflecting mirrors.

* * * * *